United States Patent
Ozaki

[11] Patent Number: 6,013,588
[45] Date of Patent: Jan. 11, 2000

[54] PRINTED CIRCUIT BOARD AND PRINTED CIRCUIT BOARD BASE MATERIAL

[75] Inventor: Yosuke Ozaki, Kokubunji, Japan

[73] Assignee: O.K. Print Corporation, Tokyo, Japan

[21] Appl. No.: 08/905,972

[22] Filed: Aug. 5, 1997

[30] Foreign Application Priority Data

Sep. 30, 1996 [JP] Japan ................................. 8-258255

[51] Int. Cl.$^7$ .................................................. B32B 3/00
[52] U.S. Cl. ..................... 442/179; 442/117; 442/228; 442/175; 442/233; 428/209; 428/408; 174/262
[58] Field of Search ................................. 442/117, 179, 442/228, 232, 103, 175, 233; 428/408, 209; 174/262

[56] References Cited

U.S. PATENT DOCUMENTS

| | | | |
|---|---|---|---|
| 2,912,382 | 11/1959 | Liao | 442/117 |
| 4,604,319 | 8/1986 | Evans et al. | 442/179 |
| 4,664,768 | 5/1987 | Scala et al. | 442/179 |
| 4,680,220 | 7/1987 | Johnson | 428/901 |
| 4,714,642 | 12/1987 | McAliley et al. | 428/114 |
| 4,747,897 | 5/1988 | Johnson | 156/307.7 |
| 4,751,146 | 6/1988 | Maeda et al. | 428/209 |
| 4,882,216 | 11/1989 | Takimoto et al. | 428/901 |
| 5,102,729 | 4/1992 | Yamaguchi et al. | 442/179 |
| 5,714,419 | 2/1998 | Choate | 442/179 |
| 5,719,090 | 2/1998 | Appelt et al. | 442/19 |
| 5,763,060 | 6/1998 | Kerrick | 428/209 |
| 5,780,366 | 7/1998 | Appelt et al. | 428/373 |

*Primary Examiner*—Timothy Speer
*Assistant Examiner*—Cathy F. Lam
*Attorney, Agent, or Firm*—Birch, Stewart, Kolasch & Birch, LLP

[57] ABSTRACT

The present invention relates to a printed circuit board and a printed circuit board base material for use in the printed circuit board. The printed circuit board base material of the present invention is produced by impregnating a carbon core material such as carbon cloth with a first resin such as epoxy resin, and the printed circuit board of the present invention is characterized in that resin pores are opened on the printed circuit board base material, second resins such as epoxy resins are filled in the resin pores, circuit layers are formed on the printed circuit board base material, through holes connecting the circuit layer together are provided, and the center line of the resin pore is approximately in line with the center line of the through hole.

9 Claims, 3 Drawing Sheets

PRINTED CIRCUIT BOARD AND PRINTED CIRCUIT BOARD BASE MATERIAL

BACKGROUND OF THE INVENTION

1. Field of the Invention

The present invention relates to a printed circuit board and a printed circuit board base material for use in the printed circuit board.

2. Description of the Prior Art

On conventional printed circuit boards, circuit layers are formed on a printed circuit board base material comprising glass cloth impregnated with an epoxy resin, through holes are provided for connecting the circuit layers.

When electronic parts are mounted on such printed circuit boards, however, the coefficient of thermal expansion of the printed circuit board base material is larger than the coefficient of thermal expansion of the electronic parts, so that the thermal expansion of the printed circuit board base material is larger than the thermal expansion of the electronic parts, which may sometimes damage the electronic parts. Furthermore, the specific gravity of the printed circuit board base material is so large that the printed circuit board weighs more.

SUMMARY OF THE INVENTION

It is an object of the present invention to provide a printed circuit board of a light weight and with no occurrence of any damage on the electronic parts mounted thereon.

Additionally, it is another object of the present invention to provide a printed circuit board base material for manufacturing such printed circuit board.

According to the present invention, it is provided a printed circuit board, characterized in that at least one circuit layer is formed on at least one printed circuit board base material comprising a carbon core material impregnated with a resin.

Additionally, it is provided a printed circuit board base material comprising a carbon core material impregnated with a resin.

Because the coefficient of thermal expansion of the printed circuit board base material is almost equal to the coefficient of thermal expansion of the electronic parts mounted thereon in the printed circuit board of the present invention, the thermal expansion of the electronic parts is approximately equal to the thermal expansion of the printed circuit board base material, involving thus no occurrence of any damage on the electronic parts. Because the specific gravity of the printed circuit board base material is small, the weight of the printed circuit board is also light.

Additionally, the printed circuit board base material of the present invention can be used for manufacturing a printed circuit board of a light weight and with no occurrence of the electronic parts.

DETAILED DESCRIPTION OF THE INVENTION

Figure 1:
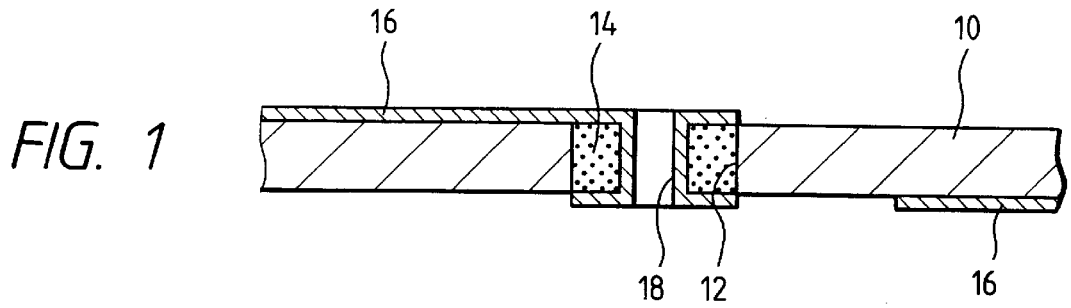
FIG. 1 is a schematic cross-sectional view showing the printed circuit board of the present invention.

FIG. 1 shows the printed circuit board in accordance with the present invention, wherein the printed circuit board base material of the present invention is used. Resin pores 12 are opened on printed circuit board base material 10 comprising carbon cloth impregnated with an epoxy resin, and epoxy resins 14 are filled in the resin pores 12; first circuit layers 16 are formed on the printed circuit board base material 10; through holes 18 connecting the circuit layers 16 together are provided; and the center line of the resin pore 12 is approximately in line with the center line of the through hole 18.

When electronic parts containing semiconductor devices are mounted on the printed circuit board shown in FIG. 1 by direct bonding, the coefficient of thermal expansion of the printed circuit board base material 10 is almost equal to the coefficient of thermal expansion of the electronic parts, so that the thermal expansion of the electronic parts is almost equal to the thermal expansion of the printed circuit board base material 10. Thus, no damage occurs on the electronic parts. The whole printed circuit board is light because the specific gravity of the printed circuit board base material 10 is small. Therefore, the printed circuit board base material 10 can be used for satellite systems, such as satellite survey rocket. Because the carbon cloth in the printed circuit board base material 10 is conductive, noise can be prevented. Because the epoxy resin 14 is present in between the carbon cloth present in the central part of the printed circuit board base material 10 and the through hole 18, no conduction occurs between the carbon cloth of the printed circuit board base material 10 and the through hole 18.

Furthermore, the printed circuit board base material 10 shown in FIG. 1 can be used for manufacturing a printed circuit board with no damage on the electronic parts, of less weight and with the potency of preventing noise.

Figure 2A:
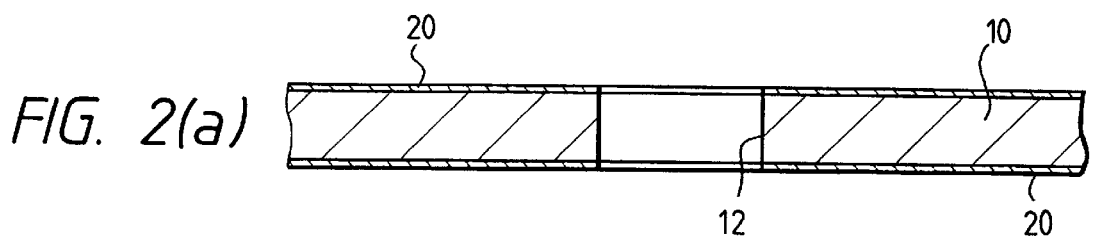
FIGS. 2(a) to 2(e) are explanatory views of the method for manufacturing the printed circuit board shown in FIG. 1.
Figure 2B:
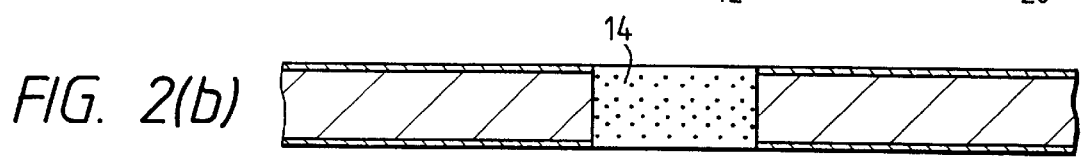
Figure 2C:
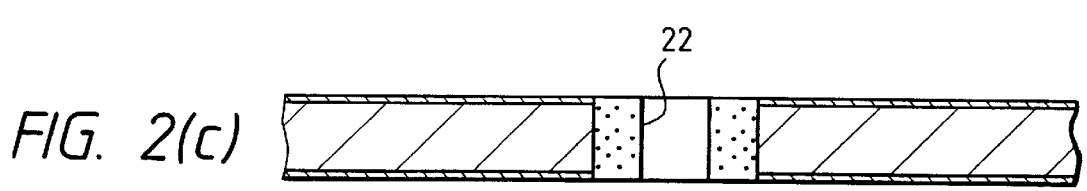
Figure 2D:
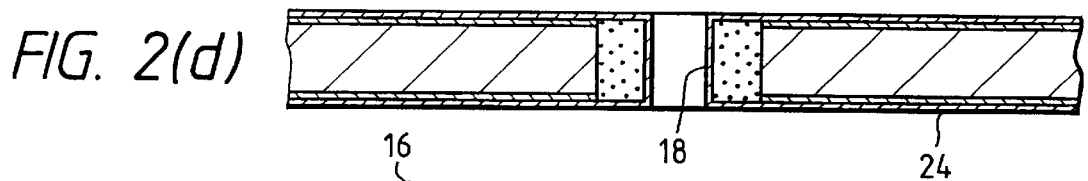
Figure 2E:
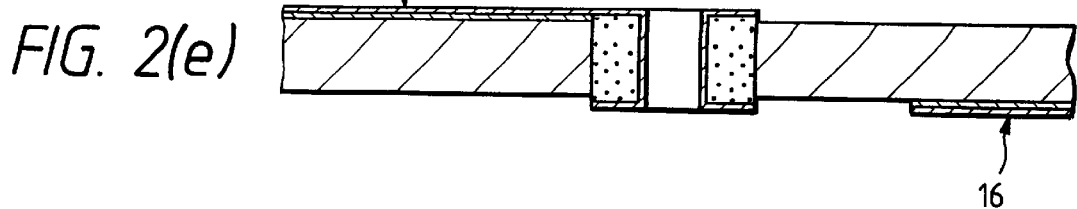

Then, the method for manufacturing the printed circuit board shown in FIG. 1 is described with reference to FIG. 2. As shown in FIG. 2(a), firstly, copper foils 20 are attached on both the faces of the printed circuit board base material 10. Resin pores 12 are opened at positions where through holes 18 for the printed circuit board base material 10 are to be provided. As shown in FIG. 2(b), then, epoxy resins 14 are filled in the resin pores 12. As shown in FIG. 2(c), subsequently, through-hole openings 22 passing through the central part of the resin pores 12 are opened. As shown in FIG. 2(d), then, electroless copper plating and electrolytic copper plating are carried out to mount copper-plated layer 24 on the inner face of the through-hole opening 22 and the surface of the copper foils 20 and the like, to provide through holes 18. As shown in FIG. 2(e), subsequently, the copper-plated layer 24 and the copper foils 20 are selectively etched to form circuit layers 16.

Figure 3:
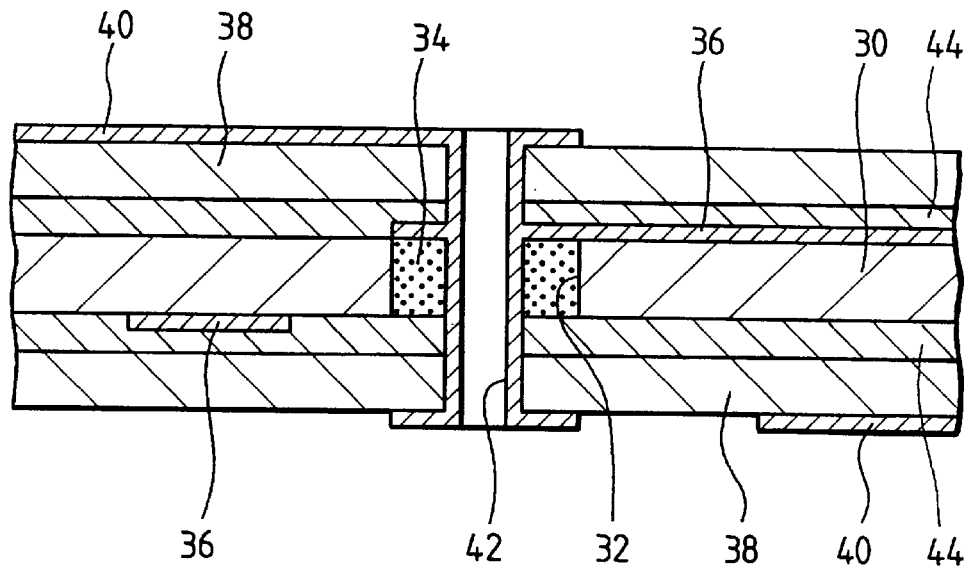
FIG. 3 is a schematic cross-sectional view showing another printed circuit board of the present invention.

Another printed circuit board of the present invention is shown in FIG. 3. Resin pores 32 are opened on the printed circuit board base material 30 comprising carbon cloth impregnated with an epoxy resin. Epoxy resins 34 are filled in the resin pores 32, while first circuit layers 36 are formed on the printed circuit board base material 30; resin plates 38 are arranged onto prepreg 44 on both the faces of the printed circuit board base material 30, while second circuit layers 40 are formed on the surface of the resin plates 38. Then, through holes 42 to connect the circuit layers 36, 40 together are provided, and the center line of the resin pore 32 is approximately in line with the center line of the through hole 42.

Figure 4A:
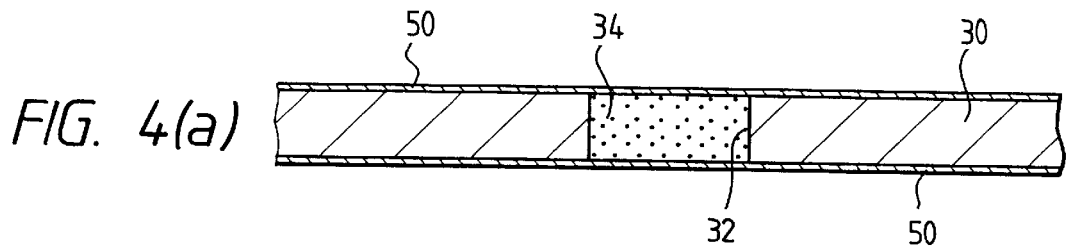
FIGS. 4(a) to 4(d) are explanatory views of the method for manufacturing the printed circuit board shown in FIG. 3.
Figure 4B:
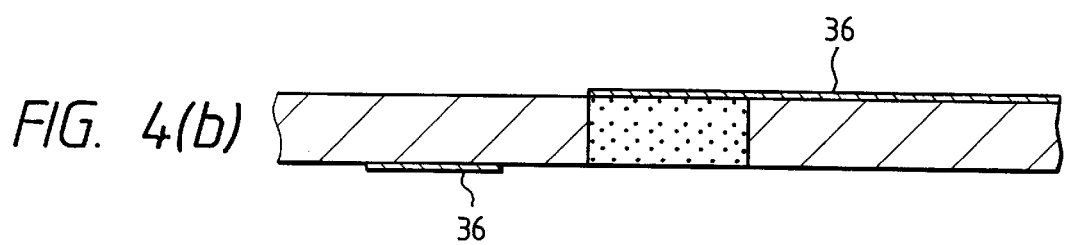
Figure 4C:
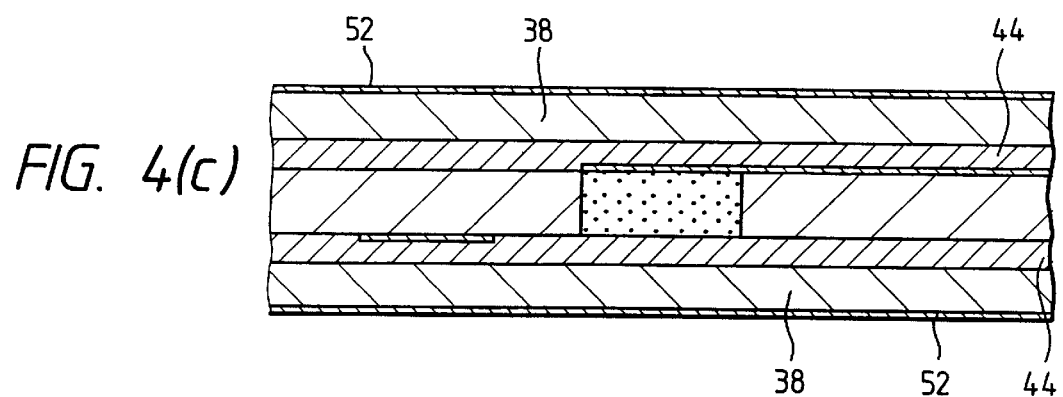
Figure 4D:
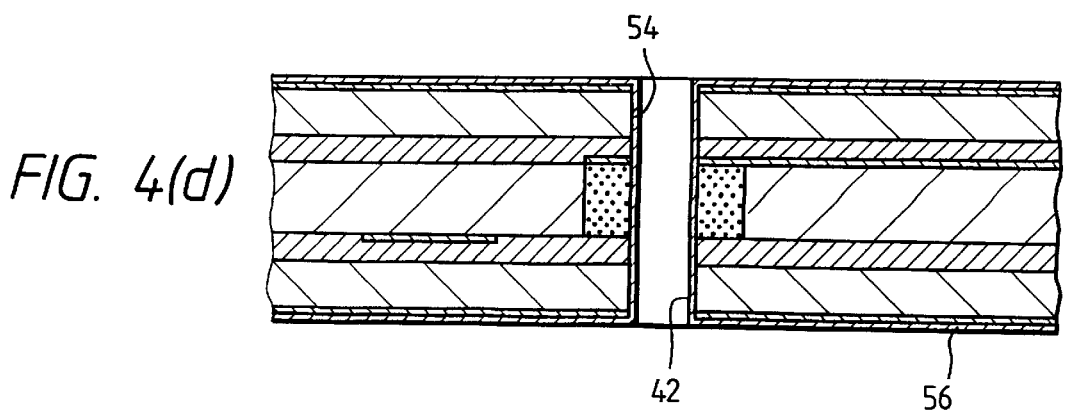

Then, the method for manufacturing the printed circuit board shown in FIG. 3 is described with reference to FIG. 4. As shown in FIG. 4(a), then, resin pores 32 are opened at positions where through holes 42 for the printed circuit board base material 30 are to be provided; and after filling epoxy resins 34 in the resin pores 32, copper foils 50 are attached on both the faces of the printed circuit board base material 30. As shown in FIG. 4(b), then, the copper foils 50 are selectively etched whereby circuit layers 36 are formed. As shown in FIG. 4(c), then, resin plates 38 with the copper foil 52 attached thereon are arranged through prepreg 44 on both the faces of the printed circuit board base material 30. As shown in FIG. 4(d), then, through-hole openings 54 passing through the central part of the resin pores 32 are opened, electroless copper plating and electrolytic copper plating are carried out to mount copper-plated layer 56 on the inner face of the through-hole openings 54 and the surface of the copper foils 52 and the like, to provide through holes 42. Subsequently, by selective etching of the copper-plated layer 56 and the copper foils 52, circuit layers 40 are formed.

Figure 5:
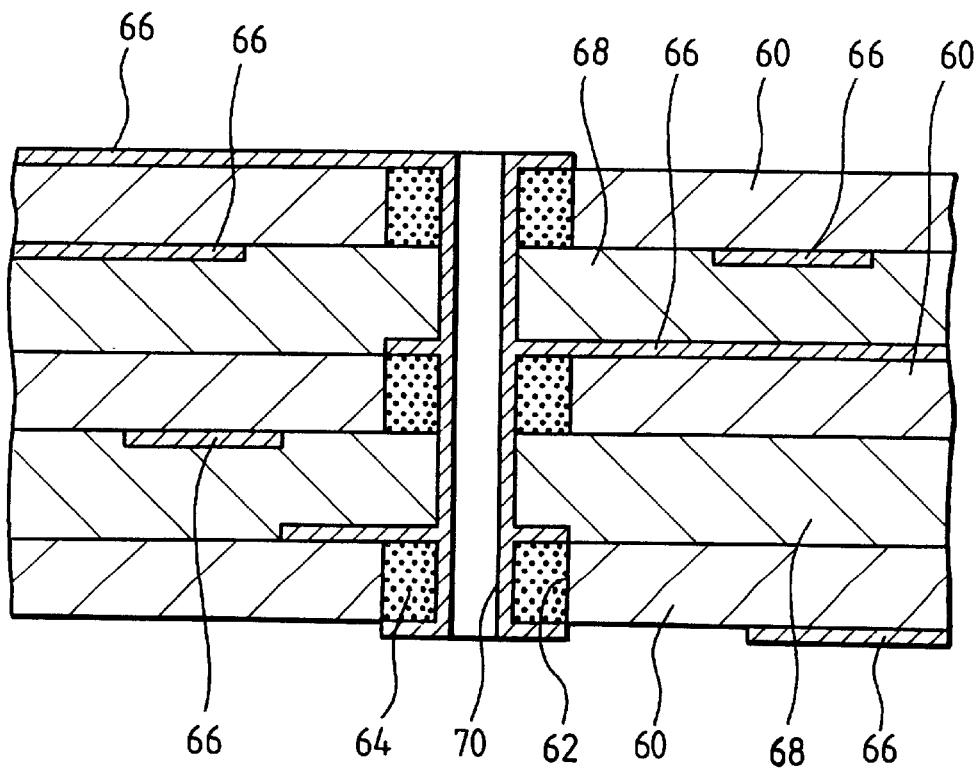
FIG. 5 is a schematic cross-sectional view showing an additional printed circuit board of the present invention

Another printed circuit board of the present invention is shown in FIG. 5. Resin pores 62 are opened on the printed circuit board base materials 60 comprising carbon cloth impregnated with an epoxy resin. Epoxy resins 64 are filled in the resin pores 62, while first circuit layers 66 are formed on the printed circuit board base material 60; two sheets of prepreg 68 are arranged in between three sheets of the printed circuit board base material 60, while through holes 70 connecting the circuit layers 66 are provided, and the center line of the resin pore 62 is approximately in line with the center line of the through hole 70.

In the above embodiment, the carbon cloth is impregnated with an epoxy resin as the first resin, but the carbon cloth can be impregnated with another resin as the first resin. In the above embodiment, the carbon cloth is used as a carbon core material, but non-woven fabric consisting of carbon, particle carbon or the like can satisfactorily be used as the carbon core material. In the aforementioned embodiment, as the second resin, epoxy resins 14, 34, 64 are filled in the resin pores 12, 32, 62, but another resin can be filled in the resin pores 12, 32, 62 as the second resin. In the above embodiment, through holes 18, 42, 70 are provided at portions where the epoxy resins 14, 34, 64 are filled, but only if through holes are provided at positions where no epoxy resins 14, 34, 64 are filled, the carbon cloth present in the central part of the printed circuit board base materials 10, 30, 60 can be conductive to the circuit layers 16, 36, 66.

What is claimed is:

1. A printed circuit board comprising:

(a) at least one sheet of printed circuit board base material which comprises a carbon core material with a first resin, said printed circuit board base material having two faces;

(b) at least one circuit layer formed on said printed circuit board base material;

(c) through holes passing through the printed circuit board base material; and (d) resin pores opened at positions where said through holes for the printed circuit board base material are to be provided, wherein the resin pores are filled with a second resin to form said through holes, so that the through holes pass through the central part of the resin pores such that a center line of said through holes is approximately in line with a center line of said resin pores.

2. The printed circuit board according to claim 1, wherein said printed circuit board further comprises at least one prepreg sheet on a surface of said at least one sheet of printed circuit board base material.

3. The printed circuit board according to claim 2, which further comprises:

prepregs disposed on both faces of the printed circuit base board material;
   resin plates disposed on each of the prepregs; and
   a second circuit layer formed on a surface of each resin plate.

4. The printed circuit board according to claim 2, wherein one of said at least one prepreg sheet is arranged in between two sheets of said printed circuit board base material.

5. The printed circuit board according to claim 1, wherein carbon cloth is used as said carbon core material.

6. The printed circuit board according to claim 1, wherein non-woven fabric consisting of carbon is used as said carbon core material.

7. The printed circuit board according to claim 1, wherein particle carbon is used as said carbon core material.

8. The printed circuit board according to claim 5, 6 or 7, wherein an epoxy resin is used as said first resin.

9. The printed circuit board according to claim 5, 6 or 7, wherein an epoxy resin is used as said second resin.

* * * * *